(12) United States Patent
Kishioka

(10) Patent No.: US 8,674,043 B2
(45) Date of Patent: Mar. 18, 2014

(54) PHOTOSENSITIVE RESIN COMPOSITION CONTAINING COPOLYMER

(75) Inventor: Takahiro Kishioka, Toyama (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 0 days.

(21) Appl. No.: 13/395,336

(22) PCT Filed: Aug. 30, 2010

(86) PCT No.: PCT/JP2010/064717
§ 371 (c)(1),
(2), (4) Date: Mar. 9, 2012

(87) PCT Pub. No.: WO2011/030688
PCT Pub. Date: Mar. 17, 2011

(65) Prior Publication Data
US 2012/0172557 A1  Jul. 5, 2012

(30) Foreign Application Priority Data
Sep. 14, 2009  (JP) .................. 2009-212329

(51) Int. Cl.
| | | |
|---|---|---|
| C08F 12/26 | (2006.01) | |
| C08F 12/32 | (2006.01) | |
| C08F 20/52 | (2006.01) | |
| C08F 22/40 | (2006.01) | |
| C08F 220/52 | (2006.01) | |
| C08F 222/40 | (2006.01) | |

(52) U.S. Cl.
USPC ........... 526/261; 526/264; 526/263; 526/262; 526/302; 430/270.1

(58) Field of Classification Search
USPC ........ 526/261, 264, 263, 262, 302; 430/270.1
See application file for complete search history.

(56) References Cited

U.S. PATENT DOCUMENTS

| 6,586,560 B1 | 7/2003 | Chen et al. | |
| 6,949,678 B2 * | 9/2005 | Kunimoto et al. | ............. 564/255 |

FOREIGN PATENT DOCUMENTS

| CN | 1954264 A | 4/2007 |
| CN | 101359174 A | 2/2009 |
| EP | 0 140 273 A2 | 5/1985 |
| JP | A-62-156110 | 7/1987 |
| JP | B2-6-23842 | 3/1994 |
| JP | A-2001-354822 | 12/2001 |
| JP | A-2003-131375 | 5/2003 |
| JP | A-2004-224894 | 8/2004 |
| JP | 2005-A-300825 | 10/2005 |
| JP | A-2005-353785 | 12/2005 |
| JP | 4126556 B2 * | 7/2008 |
| JP | B2-4126556 | 7/2008 |
| JP | A-2008-303315 | 12/2008 |
| WO | WO 2008/143095 A1 | 11/2008 |

OTHER PUBLICATIONS

Oct. 12, 2010 International Search Report issued in International Patent Application No. PCT/JP2010/064717.
Jan. 18, 2013 Office Action issued in Chinese Patent Application No. 201080038024.6 (with English translation).

* cited by examiner

*Primary Examiner* — Ling Choi
*Assistant Examiner* — David L Miller
(74) *Attorney, Agent, or Firm* — Oliff PLC

(57) ABSTRACT

There is provided a photosensitive resin composition having desired properties. A photosensitive resin composition comprising: a component (A) that is a copolymer including a structural unit of Formula (1) and at least one structural unit of Formula (2), and a component (B) that is a photosensitizer:

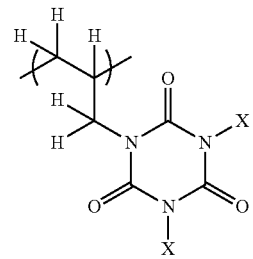

(1)

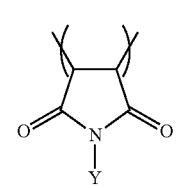

(2)

(where two Xs are independently a hydrogen atom, a $C_{1-5}$ alkyl group, a $C_{5-6}$ cycloalkyl group, a phenyl group, or a benzyl group and Y is a hydrogen atom, a $C_{1-5}$ alkyl group, a $C_{5-6}$ cycloalkyl group, a phenyl group, or a benzyl group provided that each of a part or all of the hydrogen atoms in the alkyl group, the cycloalkyl group, the phenyl group, and the benzyl group is optionally substituted with a halogen atom, a carboxy group, a hydroxy group, an amino group, or a nitro group).

5 Claims, No Drawings

PHOTOSENSITIVE RESIN COMPOSITION CONTAINING COPOLYMER

TECHNICAL FIELD

The present invention relates to a copolymer obtained using allyl isocyanurate as a raw material, and a photosensitive resin composition containing the copolymer. The present invention also relates to the photosensitive resin composition capable of forming a film that is remarkably enhanced in light resistance, transparency, heat resistance, heat discoloration resistance, solvent resistance, crack resistance, and other properties.

BACKGROUND ART

Polyhydroxystyrene has been known as a microlens-forming material. However, polyhydroxystyrene has problems described below and therefore there is scope for improvement. Using polyhydroxystyrene as a microlens-forming material, the microlens is likely to lose its hemispherical shape due to heating at high temperatures, and therefore microlenses of a uniform shape are difficult to be formed. In addition, polyhydroxystyrene is prone to discoloration by heat treatment and tends to deteriorate in transparency, so that the discoloration of the microlens may be observed during use.

A composition for forming anti-reflective coatings that contains a polymer having a triazinetrione structure has been suggested (Patent Document 1), and a photoresist composition and a material to be used for forming a resist protective layer for immersion lithography, both of which contain a maleimide copolymer, and the like have been suggested (Patent Document 2 to Patent Document 4).

In order to develop insulating films for display devices such as liquid crystal displays (LCD) and organic electroluminescent displays, a process for forming an insulating film for a display device, in which a radiation-sensitive resin composition that contains an alkali-soluble copolymer composed of indene, maleimide, and an N-substituted maleimide, a 1,2-naphthoquinonediazide compound, and a crosslinking agent is used, has been suggested (Patent Document 5).

A maleimide copolymer that contains an unsubstituted maleimide-based monomer structural unit, a styrene-based monomer structural unit, and a (meth)acrylic acid-based monomer structure, and that is very excellent in compatibility with a multifunctional (meth)acrylate, is excellent in alkali solubility, and therefore is expected to be suitably used in various applications requiring such characteristics has been suggested (Patent Document 6).

However, none of these related-art documents are intended to provide applications as a photosensitive resin composition for microlenses, nor suggest specific methods for nor the effects of incorporating, into a photosensitive resin composition for microlenses, a copolymer that is obtained using allyl isocyanurate as a raw material, particularly a copolymer that is obtained using allyl isocyanurate and unsubstituted maleimide and/or an N-substituted maleimide as raw materials.

A radiation-sensitive resin composition that contains [A] a polymer of (a1) an unsaturated carboxylic acid and/or an unsaturated carboxylic anhydride, (a2) an epoxy group-containing unsaturated compound, (a3) a maleimide monomer, and (a4) other olefin unsaturated compound, and [B] a 1,2-quinonediazide compound has been reported (Patent Document 7). The document describes that the radiation-sensitive resin composition reported therein has high radiation-sensitiveness and can easily form a patterned thin film that is excellent in solvent resistance, heat resistance, transparency, and heat discoloration resistance. However, the document suggests neither the profile nor the heat resistance of a pattern that is to be formed from the composition. The documents do not describe maleimide monomer to include unsubstituted maleimide, either.

RELATED ART DOCUMENTS

Patent Documents

Patent Document 1: Japanese Patent No. 4126556
Patent Document 2: U.S. Pat. No. 6,586,560 (B1)
Patent Document 3: Japanese Examined Patent Application Publication No. 6-23842 (JP 6-23842 B)
Patent Document 4: Japanese Patent Application Publication No. 2008-303315 (JP 2008-303315 A)
Patent Document 5: Japanese Patent Application Publication No. 2003-131375 (JP 2003-131375 A)
Patent Document 6: Japanese Patent Application Publication No. 2004-224894 (JP 2004-224894 A)
Patent Document 7: Japanese Patent Application Publication No. 2001-354822 (JP 2001-354822 A)

SUMMARY OF THE INVENTION

Problem to be Solved by the Invention

The present invention has been made based on the above circumstances, and it is an object of the present invention to provide a photosensitive resin composition capable of producing a product that is remarkably enhanced in light resistance, transparency, heat resistance, heat discoloration resistance, solvent resistance, patternability, and crack resistance.

It is another object of the present invention to provide a cured film and a microlens that are formed from the photosensitive resin composition and are excellent in these properties.

Means for Solving the Problem

The inventors of the present invention have conducted intensive research to solve these problems and, as a result, have now completed the present invention.

The present invention provides:

as a first aspect, a photosensitive resin composition including:

a component (A) that is a copolymer including a structural unit of Formula (1), and a component (B) that is a photosensitizer:

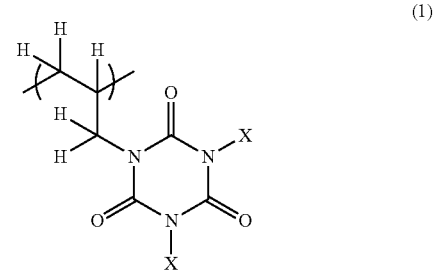

(where two Xs are independently a hydrogen atom, a $C_{1-5}$ alkyl group, a $C_{5-6}$ cycloalkyl group, a phenyl group, or a benzyl group provided that each of a part or all of the hydrogen atoms in the alkyl group, the cycloalkyl group, the phenyl group, and the benzyl group is optionally substituted with a halogen atom, a carboxy group, a hydroxy group, an amino group, or a nitro group).

In the photosensitive resin composition according to the first aspect, the component (A) is a copolymer including, besides the structural unit of Formula (1), at least one maleimide structural unit of Formula (2):

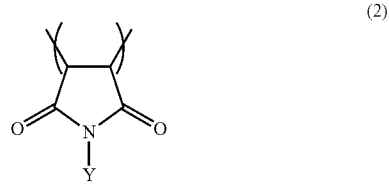

(where Y is a hydrogen atom, a $C_{1-5}$ alkyl group, a $C_{5-6}$ cycloalkyl group, a phenyl group, or a benzyl group provided that each of a part or all of the hydrogen atoms in the alkyl group, the cycloalkyl group, the phenyl group, and the benzyl group is optionally substituted with a halogen atom, a carboxy group, a hydroxy group, an amino group, or a nitro group).

As a second aspect, in the photosensitive resin composition according to the first aspect, the weight-average molecular weight of the copolymer is 1000 to 30000.

As a third aspect, the photosensitive resin composition according to the first aspect or the second aspect further includes, besides the component (A) and the component (B), a crosslinking agent as a component (C).

The present invention provides, as a fourth aspect, a cured film that is obtained from the photosensitive resin composition as described in any one of the first aspect to the third aspect.

The present invention provides, as a fifth aspect, a microlens that is formed from the photosensitive resin composition as described in any one of the first aspect to the third aspect.

Effects of the Invention

The film that is formed from the photosensitive resin composition of the present invention can be excellent in light resistance, transparency, heat resistance, heat discoloration resistance, solvent resistance, and crack resistance.

A pattern that is formed from the photosensitive resin composition of the present invention can also be excellent in heat resistance, solvent resistance, and the like.

Using different species of maleimide in the synthesis of the copolymer that is to be contained in the photosensitive resin composition of the present invention, various microlenses with different refractive indices can be formed from the composition. Moreover, a desired copolymer can be obtained at a higher yield by copolymerizing unsubstituted maleimide and/or an N-substituted maleimide with allyl isocyanurate so as to obtain an alternating copolymer rather than by polymerizing allyl isocyanurates (yield: not higher than 10%).

According to these, the film that is formed from the photosensitive resin composition of the present invention can remarkably reduce the chances of microlens discoloration and deformation during heat treatment at high temperatures at the time of film formation or of forming peripheral devices such as wiring. In the case of forming electrodes and/or wiring after microlens formation, problems such as the deformation and the peeling off of the microlens caused by the action of organic solvent can also remarkably be reduced.

Therefore, the photosensitive resin composition of the present invention is suitable as a microlens-forming material.

MODES FOR CARRYING OUT THE INVENTION

The present invention provides a photosensitive resin composition containing a component (A) and a component (B). Each component will be hereinafter described in detail.

The solid content that is left after removing solvent from the photosensitive resin composition of the present invention is usually 1 to 50% by mass.

<Component (A)>

The component (A) of the present invention is a copolymer having at least a structural unit of Formula (1):

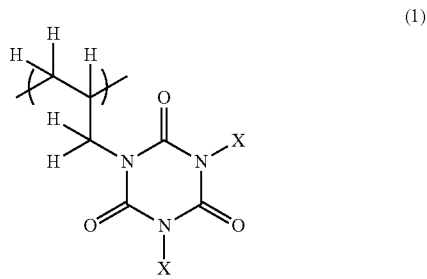

(where two Xs are independently a hydrogen atom, a $C_{1-5}$ alkyl group, a $C_{5-6}$ cycloalkyl group, a phenyl group, or a benzyl group provided that each of a part or all of the hydrogen atoms in the alkyl group, the cycloalkyl group, the phenyl group, and the benzyl group is optionally substituted with a halogen atom, a carboxy group, a hydroxy group, an amino group, or a nitro group).

The component (A) of the present invention is a copolymer having, as a structural unit or structural units besides the structural unit of Formula (1), one, two, or more maleimide structural unit(s) of Formula (2):

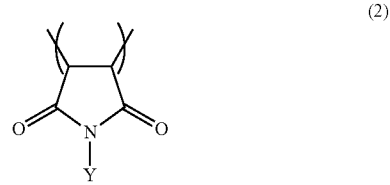

(where Y is a hydrogen atom, a $C_{1-5}$ alkyl group, a $C_{5-6}$ cycloalkyl group, a phenyl group, or a benzyl group provided that each of a part or all of the hydrogen atoms in the alkyl group, the cycloalkyl group, the phenyl group, and the benzyl group is optionally substituted with a halogen atom, a carboxy group, a hydroxy group, an amino group, or a nitro group).

The component (A) of the present invention may be a copolymer having, as a structural unit or structural units besides the structural unit of Formula (1), one, two, or more structural unit(s) selected from structural units of Formula (3), Formula (4), Formula (5), and Formula (6) below instead of the structural unit(s) of Formula (2) or together with the structural unit(s) of Formula (2):

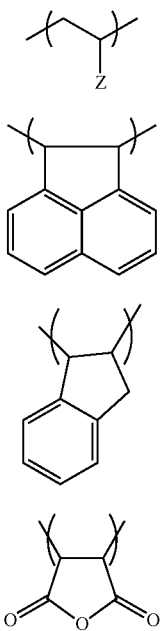

(3)
(4)
(5)
(6)

(where Z is a phenyl group, a naphthyl group, an anthracenyl group, a biphenylyl group, a carbazole group, or a $C_{1-8}$ alkoxy group provided that each of a part or all of the hydrogen atoms in the phenyl group, the naphthyl group, the anthracenyl group, the biphenylyl group, and the carbazole group is optionally substituted with a halogen atom, a carboxy group, a hydroxy group, an amino group, or a nitro group).

In case of the copolymer that is the component (A) having the structural unit(s) of Formula (2) and/or Formula (3) besides the structural unit of Formula (1), the molar ratio of the structural unit of Formula (1) to the structural unit(s) of Formula (2) and/or Formula (3) is usually 10 to 90:90 to 10 and is preferably 20 to 70:80 to 30.

The weight-average molecular weight of the polymer is usually 1000 to 30000 and is preferably 1500 to 20000. The weight-average molecular weight is obtained by gel permeation chromatography (GPC) using polystyrene as a standard sample.

The content of the component (A) in the photosensitive resin composition of the present invention is usually 1 to 99% by mass and is preferably 10 to 95% by mass in the solid content of the photosensitive resin composition.

In the present invention, the processes to obtain the copolymer having one, two, or more maleimide structural unit(s) of Formula (2) besides the structural unit of Formula (1), or the copolymer having the structural unit of Formula (1) and one, two, or more structural unit(s) selected from the structural units of Formula (3), Formula (4), Formula (5), and Formula (6), are not particularly limited and, however, the copolymers are generally obtained by a polymerization reaction of a monomer mixture containing the monomer species to be used, in a solvent usually at a temperature of 50 to 110° C.

<Component (B)>

A photosensitizer as the component (B) of the present invention is not particularly limited provided that the photosensitizer is a compound that can be used as a photosensitizing component, and a 1,2-naphthoquinonediazide compound is preferable.

As the 1,2-naphthoquinonediazide compound, hydroxy group-containing compounds in which 10 to 100 mol %, preferably 20 to 95 mol %, of the hydroxy groups are esterified as 1,2-naphthoquinone diazide sulfonate can be used.

Examples of the hydroxy group-containing compounds can include phenolic compounds such as phenol, o-cresol, m-cresol, p-cresol, hydroquinone, resorcinol, catechol, methyl gallate, ethyl gallate, 3,3-tris(4-hydroxyphenyl)butane, 4,4-isopropylidenediphenol, 2,2-bis(4-hydroxyphenyl)propane, 1,1-bis(4-hydroxyphenyl)cyclohexane, 4,4'-dihydroxyphenyl sulfone, 4,4-hexafluoroisopropylidene diphenol, 4,4',4''-trishydroxyphenylethane, 1,1,1-trishydroxyphenylethane, 4,4'-[1-[4-[1-(4-hydroxyphenyl)-1-methylethyl]phenyl]ethylidene]bisphenol, 2,4-dihydroxybenzophenone, 2,3,4-trihydroxybenzophenone, 2,2',4,4'-tetrahydroxybenzophenone, 2,3,4,4'-tetrahydroxybenzophenone, and 2,2',3,4,4'-pentahydroxybenzophenone, and aliphatic alcohols such as ethanol, 2-propanol, 4-butanol, cyclohexanol, ethylene glycol, propylene glycol, diethylene glycol, dipropylene glycol, 2-methoxyethanol, 2-butoxyethanol, 2-methoxypropanol, 2-butoxypropanol, ethyl lactate, and butyl lactate.

The photosensitizer can be used alone or as a combination of two or more of these.

The content of the component (B) in the photosensitive resin composition of the present invention is usually 1 to 50% by mass in the solid content of the photosensitive resin composition.

<Component (C)>

In the case where the present invention includes a crosslinking agent as a component (C), the crosslinking agent is a compound that forms a bond with other constituents such as resins and other crosslinking agent molecules by the action of heat or an acid. Examples of the crosslinking agent can include multifunctional (meth)acrylate compounds, epoxy compounds, hydroxymethyl group-substituted phenolic compounds, compounds containing an alkoxyalkylated amino group, and the like.

The crosslinking agent can be used alone or as a combination of two or more of these.

Examples of the multifunctional (meth)acrylate compounds can include trimethylolpropane tri(meth)acrylate, ditrimethylolpropane tetra(meth)acrylate, pentaerythritol tri(meth)acrylate, pentaerythritol tetra(meth)acrylate, dipentaerythritol penta(meth)acrylate, dipentaerythritol hexa(meth)acrylate, glycerin tri(meth)acrylate, tris(2-hydroxyethyl)isocyanurate tri(meth)acrylate, ethylene glycol di(meth)acrylate, 1,3-butanediol di(meth)acrylate, 1,4-butanediol di(meth)acrylate, 1,6-hexanediol di(meth)acrylate, neopentyl glycol di(meth)acrylate, diethylene glycol di(meth)acrylate, Methylene glycol di(meth)acrylate, dipropylene glycol di(meth)acrylate, bis(2-hydroxyethyl)isocyanurate di(meth)acrylate, and the like.

Examples of the epoxy compounds can include novolac epoxy resins, bisphenol epoxy resins, alicyclic epoxy resins, aliphatic epoxy resins, and the like.

Examples of the hydroxymethyl group-substituted phenolic compounds can include 2-hydroxymethyl-4,6-dimethylphenol, 1,3,5-trihydroxymethyl benzene, 3,5-dihydroxymethyl-4-methoxytoluene [2,6-bis(hydroxymethyl)-p-cresol], and the like.

Examples of the compounds containing an alkoxyalkylated amino group can include nitrogen-containing compounds having a plurality of active methylol groups in a molecule, such as (poly)methylolated melamine, (poly)methylolated glycoluril, (poly)methylolated benzoguanamine, and (poly)methylolated urea, provided that at least one of the hydrogen atoms in the hydroxy groups of the methylol groups is substituted with an alkyl group such as a methyl group and a butyl group, and the like.

The compound containing an alkoxyalkylated amino group may be a mixture of a plurality of substituted compounds or may be a compound containing an oligomer component that is partly self-condensed, either of which can also be used. Specific examples can include commercial products under the CYMEL Series such as hexamethoxymethylmelamine (manufactured by Nihon Cytec Industries Inc. "CYMEL (registered trademark) 303"), tetrabutoxymethyl glycoluril (manufactured by Nihon Cytec Industries Inc. "CYMEL (registered trademark) 1170"), and tetramethoxymethylbenzoguanamine (manufactured by Nihon Cytec Industries Inc. "CYMEL (registered trademark) 1123"), and the like.

Among the compounds containing an alkoxyalkylated amino group, hexamethoxymethylmelamine of Formula (7) is preferable.

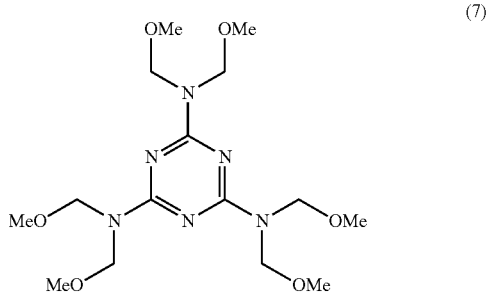 [SMILES: COCN(COC)c1nc(N(COC)COC)nc(N(COC)COC)n1]

(7)

The content of the component (C) in the photosensitive resin composition of the present invention is usually 1 to 50% by mass in the solid content of the photosensitive resin composition.

The process for preparing the photosensitive resin composition of the present invention is not particularly limited, and examples of the process include a process of dissolving the copolymer as the component (A) in a solvent and, to the resultant solution, mixing in the photosensitizer as the component (B) and the crosslinking agent as the component (C) in a predetermined proportion to obtain a homogeneous solution. This preparation process can include, where appropriate, further adding and mixing other additives in an appropriate stage of the process.

The solvent is not particularly limited provided that the solvent dissolves the component (A) to the component (C). Examples of the solvent can include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, propylene glycol manobutyl ether, propylene glycol monobutyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl acetate, butyl acetate, ethyl lactate, butyl lactate, 2-heptanone, γ-butyrolactone, and the like.

The solvent can be used alone or as a combination of two or more of these.

Among these solvents, propylene glycol monomethyl ether, propylene glycol monomethyl ether acetate, 2-heptanone, ethyl lactate, butyl lactate, and cyclohexanone are preferable from the viewpoint of enhancing the leveling property of the coating.

The photosensitive resin composition of the present invention can contain a surfactant in order to enhance the coating property.

Examples of the surfactant can include nonionic surfactants including polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene/polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, fluorine-based surfactants including EFTOP [registered trademark] EF 301, EF 303, and EF 352 (manufactured by Mitsubishi Materials Electronic Chemicals Co., Ltd. (formerly Jemco Inc.)), MEGAFAC [registered trademark] F 171, F 173, and R30 (manufactured by DIC Corporation (formerly Dainippon Ink and Chemicals, Inc.)), Fluorad FC 430 and FC 431 (manufactured by Sumitomo 3M Limited), AsahiGuard [registered trademark] AG 710, and Surflon [registered trademark] S-382, SC 101, SC 102, SC 103, SC 104, SC 105, and SC 106 (manufactured by ASAHI GLASS CO., LTD.), an organosiloxane polymer KP341 (manufactured by Shin-Etsu Chemical Co., Ltd.), and the like.

The surfactant can be used alone or as a combination of two or more of these.

When the surfactant is used, its content in the photosensitive resin composition of the present invention is not higher than 3% by mass, preferably not higher than 1% by mass, and more preferably not higher than 0.5% by mass, in the solid content of the photosensitive resin composition.

The resin composition of the present invention can contain additives such as a curing aid, an ultraviolet absorber, a sensitizer, a plasticizer, an antioxidant, and an adhesive aid, where appropriate, provided that they do not impair the effects achieved by the present invention.

Uses of the photosensitive resin composition of the present invention will be hereinafter described.

A substrate {for example, a semiconductor substrate such as silicon that is coated with a silicon oxide film, a semiconductor substrate such as silicon that is coated with a silicon nitride film or a silicon oxynitride film, a silicon nitride substrate, a quartz substrate, a glass substrate (including alkali-free glass, low-alkali glass, and crystallized glass), a glass substrate on which an ITO film is formed, and the like} is coated with the photosensitive resin composition of the present invention by an appropriate coating method using a spin coater or the like, followed by pre-baking using heating means such as a hot plate to form a film.

Pre-baking conditions are selected from baking temperatures of 80 to 250° C. and baking times of 0.3 to 60 minutes, as needed, and are preferably a baking temperature of 80 to 150° C. and a baking time of 0.5 to 5 minutes.

The film thickness of the film that is formed from the photosensitive resin composition of the present invention is 0.005 to 3.0 μm and is preferably 0.01 to 1.0 μm.

The resultant film then undergoes exposure through a mask (reticle) for forming a predetermined pattern. On exposure, a g-line, an i-line, a KrF excimer laser or the like can be employed. After exposure, the workpiece undergoes Post Exposure Bake, where appropriate. Conditions in Post Exposure Bake are selected from heating temperatures of 80 to 150° C. and heating times of 0.3 to 60 minutes, as needed. Subsequently, the workpiece is developed with an alkaline developer solution.

Examples of the alkaline developer solution can include aqueous alkaline solutions including aqueous solutions of alkali metal hydroxides such as potassium hydroxide and sodium hydroxide, aqueous solutions of quaternary ammonium hydroxides such as tetramethylammonium hydroxide, tetraethylammonium hydroxide, and choline, aqueous solution of amines such as ethanolamine, propylamine, and ethylenediamine, and the like.

Surfactants and the like can be added to the developer solution.

Development conditions are selected from development temperatures of 5 to 50° C. and development times of 10 to 300 seconds, as needed. Development of the film that is formed from the photosensitive resin composition of the present invention can be easily performed using an aqueous tetramethylammonium hydroxide solution (aqueous TMAH solution) at room temperature. After development, the workpiece is rinsed with ultrapure water or the like.

Exposure is then performed across the substrate by radiation with a g-line, an i-line, a KrF excimer laser, etc. Subsequently, the workpiece undergoes post-baking with heating means such as a hot plate. Post-baking conditions are selected from baking temperatures of 100 to 250° C. and baking times of 0.5 to 60 minutes, as needed.

EXAMPLES

The present invention will be hereinafter described in more detail based on Examples and Comparative Examples. However, the present invention is not limited to these Examples.

[Measurements of Weight-average Molecular Weights of Polymers Obtained in Synthesis Examples Below]

Device: a GPC system manufactured by JASCO Corporation

Column: Shodex [registered trademark] KL-804 L and 803 L

Column oven: 40° C.

Flow rate: 1 ml/minute

Eluting solution: tetrahydrofuran

POLYMER SYNTHESIS

Synthesis Example 1

33 g of monoallyl isocyanurate, 15 g of N-cyclohexylmaleimide, and 88 g of 1,4-dioxane were placed in a flask, the temperature inside the container was set at 70° C., and dissolved. A solution of 2.4 g of dimethyl 2,2'-azobis(isobutyrate) and 30 g of 1,4-dioxane was then dropped into the flask over 1 hour. After heated and refluxed for 8 hours and then cooled to room temperature, the resultant solution was added to methanol to obtain 21 g of a polymer (copolymer) having a structural unit of Formula (8) below as a white powder. A GPC analysis performed on the reaction product showed that the weight-average molecular weight of the reaction product was 8,400 in terms of standard polystyrene.

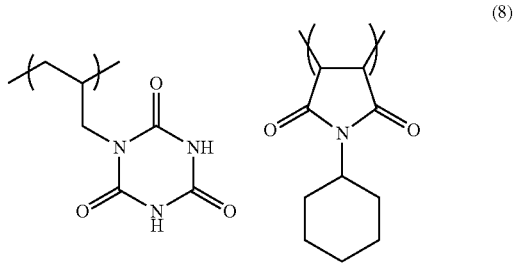

(8)

Synthesis Example 2

13 g of monoallyl isocyanurate, 15 g of N-cyclohexylmaleimide, 5 g of maleimide, and 50 g of 1,4-dioxane were placed in a flask and heated and refluxed. A solution of 1.6 g of dimethyl 2,2'-azobis(isobutyrate) and 30 g of 1,4-dioxane was dropped into the flask over 1 hour. After heated and refluxed for 10 hours and then cooled to room temperature, the resultant solution was added to methanol to obtain 12 g of a polymer (copolymer) having a structural unit of Formula (9) below as a white powder. A GPC analysis performed on the reaction product showed that the weight-average molecular weight of the reaction product was 12,900 in terms of standard polystyrene.

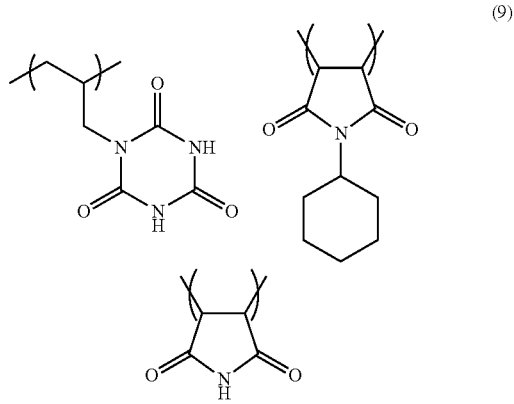

(9)

Synthesis Example 3

9.6 g of maleimide, 20 g of N-cyclohexylmaleimide, and 1.8 g of dimethyl 2,2'-azobis(isobutyrate) were dissolved in 47.1 g of 2-butanone, and the resultant solution was dropped over 4 hours into a flask in which 78.5 g of 2-butanone was being heated and refluxed. After dropping of the resultant solution is completed, a reaction was allowed to proceed for 4 hours. The reaction solution was cooled to room temperature and was then added to a mixed solvent of hexane and diethyl ether to reprecipitate a polymer, followed by drying under reduced pressure to obtain a polymer (copolymer) having a structural unit of Formula (10) below. A GPC analysis performed on the reaction product showed that the weight-average molecular weight of the reaction product was 10,400 in terms of standard polystyrene.

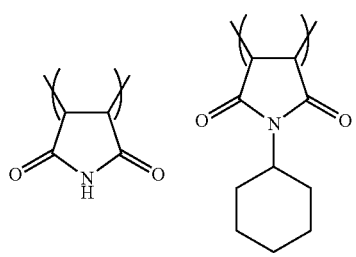

(10)

Examples 1 and 2

3 g of the polymer obtained in either of Synthesis Examples 1 and 2, 0.9 g of P-150 (manufactured by Toyo Gosei Co., Ltd.) as the photosensitizer, 0.95 g of CYMEL (registered trademark) 303 (Nihon Cytec Industries Inc.) as the crosslinking agent, and 0.01 g of MEGAFAC (registered trademark) R-30 (manufactured by DIC Corporation) as the surfactant were dissolved in 12.0 g of propylene glycol monomethyl ether and 12.0 g of propylene glycol monomethyl ether acetate to prepare a solution. The resultant solution was filtered using a polyethylene microfilter with a pore size of 0.10 μm to prepare a photosensitive resin composition (as a solution).

Reference Example 1

3 g of the polymer obtained in Synthesis Example 3, 2.7 g of P-200 (manufactured by Toyo Gosei Co., Ltd.) as the photosensitizer, 2.7 g of CYMEL (registered trademark) 303 (Nihon Cytec Industries Inc.) as the crosslinking agent, and 0.03 g of MEGAFAC (registered trademark) R-30 (manufactured by DIC Corporation) as the surfactant were dissolved in 46.0 g of propylene glycol monomethyl ether and 19.7 g of ethyl lactate to prepare a solution. The resultant solution was filtered using a polyethylene microfilter with a pore size of 0.10 μm to prepare a photosensitive resin composition (as a solution).

Comparative Example 1

9 g of poly(4-vinylphenol) (manufactured by Sigma-Aldrich Japan K.K., weight-average molecular weight of 20,000), 2.7 g of P-200 (manufactured by Toyo Gosei Co., Ltd.) as the photosensitizer, 2.7 g of CYMEL (registered trademark) 303 (Nihon Cytec Industries Inc.) as the crosslinking agent, and 0.03 g of MEGAFAC (registered trademark) R-30 (manufactured by DIC Corporation) as the surfactant were dissolved in 46.0 g of propylene glycol monomethyl ether and 19.7 g of ethyl lactate to prepare a solution. The resultant solution was filtered using a polyethylene microfilter with a pore size of 0.10 μm to prepare a photosensitive resin composition (as a solution).

[Light Resistance Test]

A quartz substrate was coated with the photosensitive resin composition prepared in either of Example 1, Example 2, Reference Example 1, and Comparative Example 1 using a spin coater, followed by pre-baking on a hot plate at 100° C. for 2 minutes to form a photosensitive resin film with a film thickness of 1 μm. The resultant was then immersed in a developer solution (0.1%-by-mass aqueous TMAH solution) for 1 minute, followed by rinsing with water for 20 seconds. Irradiation was performed across the photosensitive resin film with an i-line of 500 mJ/cm² (photobleaching), followed by post-baking on a hot plate at 200° C. for 5 minutes. The film was subjected to a light resistance test (JIS B7754) using a xenon arc lamp for 24 hours, and then the transmittance (%) of the film at a wavelength of 400 nm was measured using an ultraviolet-visible spectrophotometer UV-2550 (manufactured by SHIMADZU Corporation). Evaluation results are shown in Table 1.

TABLE 1

| | Transmittance (wavelength: 400 nm) | |
|---|---|---|
| | Before irradiation | After irradiation |
| Example 1 | 97 | 96 |
| Example 2 | 98 | 97 |
| Reference Example 1 | 99 | 96 |
| Comparative Example 1 | 98 | 90 |

Shown by the results in Table 1, the films that were formed from the photosensitive resin compositions of the present invention had high light resistance and were less prone to coloration. On the other hand, the transmittance of the film in Comparative Example 1 decreased to 90% after the light resistance test.

[Transmittance Measurement]

A quartz substrate was coated with the photosensitive resin composition prepared in either of Example 1, Example 2, Reference Example 1, and Comparative Example 1 using a spin coater, followed by pre-baking on a hot plate at 100° C. for 2 minutes. Irradiation was then performed across the quartz substrate with ultraviolet light having an exposure dose at 365 nm of 500 mJ/cm² using an ultraviolet irradiation device PLA-501(F) (manufactured by Canon Inc.) (photobleaching). Subsequently, post-baking was performed on a hot plate at 200° C. for 5 minutes to form a film with a film thickness of 1 μm. The transmittance of the film at a wavelength of 400 nm was measured using an ultraviolet-visible spectrophotometer UV-2550 (manufactured by SHIMADZU Corporation). The film was then heated at 260° C. for 3 minutes to measure the transmittance (%) at a wavelength of 400 nm. Evaluation results are shown in Table 2.

TABLE 2

| | Transmittance (wavelength: 400 nm) | |
|---|---|---|
| | 200° C. | 260° C. |
| Example 1 | 96 | 97 |
| Example 2 | 96 | 97 |
| Reference Example 1 | 97 | 96 |
| Comparative Example 1 | 95 | 78 |

Shown by the results in Table 2, the films that were formed from the photosensitive resin compositions of the present invention had high heat resistance and colored little even after heated at 260° C. The transmittance of the film in Comparative Example 1 was 95% after 5 minutes of post-baking at 200° C. and, however, decreased to 78% after another 3 minutes of heating at 260° C.

[Patterning Test]

A silicon wafer was coated with the photosensitive resin composition prepared in either of Example 1, Example 2, Reference Example 1, and Comparative Example 1 using a spin coater, followed by pre-baking on a hot plate at 100° C. for 2 minutes to form a photosensitive resin film with a film thickness of 1 μm. Exposure was then performed through a mask using an i-line stepper NSR-2205i12D (NA=0.63) (manufactured by NIKON Corporation). Subsequently, post exposure baking (PEB) was performed on a hot plate at 100° C. for 2 minutes, and the workpiece was developed in a 0.2%-by-mass aqueous TMAH solution for 1 minute, followed by rinsing with ultrapure water for 20 seconds and drying to form a dot pattern of 2 μM×2 μm. Irradiation was performed across the dot pattern with an i-line of 500 mJ/cm$^2$ using the i-line stepper (photobleaching), followed by post-baking on a hot plate at 200° C. for 5 minutes. The film was then heated at 260° C. for 3 minutes. Observation of the pattern was performed after development, rinsing, and drying, after post-baking at 200° C., and after heating at 260° C. using a scanning electron microscope S-4800 (manufactured by Hitachi High-Technologies Corporation). Evaluation results are shown in Table 3.

TABLE 3

|  | Pattern profile | |
| --- | --- | --- |
|  | 200° C. | 260° C. |
| Example 1 | ○ | ○ |
| Example 2 | ○ | ○ |
| Reference Example 1 | ○ | ○ |
| Comparative Example 1 | x | x |

In Table 3, the cases where the pattern profiles obtained after development, rinsing, and drying were retained after post-baking at 200° C. and after heating at 260° C. were evaluated as "○", and the cases where the pattern profiles were not retained after reflow were evaluated as "x".

Shown by the results in Table 3, the patterns formed using the photosensitive resin compositions of the present invention had high heat resistance and did not reflow under either condition at 200° C. or 260° C.

[Test of Dissolution in Photoresist Solvent]

A silicon wafer was coated with the photosensitive resin composition prepared in either of Example 1, Example 2, Reference Example 1, and Comparative Example 1 using a spin coater, followed by pre-baking on a hot plate at 100° C. for 2 minutes. Irradiation was then performed across the silicon wafer with ultraviolet light having an exposure dose at 365 nm of 500 mJ/cm$^2$ using an ultraviolet irradiation device PLA-501(F) (manufactured by Canon Inc.) (photobleaching). Subsequently, post-baking was performed on a hot plate at 200° C. for 5 minutes to form a film with a film thickness of 1 μm. The film was immersed in acetone, N-methylpyrrolidone, 2-propanol, and 2-heptanone at 23° C., each for 10 minutes. The difference in film thickness before and after immersion was confirmed not to exceed 5%.

[Crack Test]

A silicon wafer was coated with the photosensitive resin composition prepared in either of Example 1, Example 2, and Reference Example 1 using a spin coater, followed by pre-baking on a hot plate at 100° C. for 2 minutes to form a photosensitive resin film with a film thickness of 1 μm. After baking on a hot plate at 100° C. for 2 minutes, the workpiece was developed in a 0.2%-by-mass aqueous TMAH solution for 1 minute, followed by rinsing with ultrapure water for 20 seconds and drying. Irradiation was performed across the photosensitive resin film with an i-line of 500 mJ/cm$^2$ using the i-line stepper (photobleaching), followed by post-baking on a hot plate at 200° C. for 5 minutes. The resultant wafer piece was subjected to a thermo-hygrostat test (85° C., 85%) for 1 week. The film on the wafer was visually observed for a crack. The cases where no crack was observed were evaluated as "○" and the case where a crack was observed was evaluated as "x". Evaluation results are shown in Table 4.

TABLE 4

|  | Day 1 | After 1 week |
| --- | --- | --- |
| Example 1 | ○ | ○ |
| Example 2 | ○ | ○ |
| Reference Example 1 | ○ | x |

Shown by the results in Table 4, the films obtained from the photosensitive resin compositions of the present invention were less likely to crack.

The invention claimed is:

1. A microlens formed from a photosensitive resin composition comprising:
    a component (A) that is a copolymer including a structural unit of Formula (1) and at least one structural unit of Formula (2), and
    a component (B) that is a photosensitizer selected from hydroxy group-containing compounds in which 10 to 100 mol % of the hydroxy groups are esterified as 1,2-naphthoquinone diazide sulfonate:

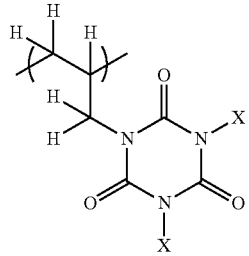

(1)

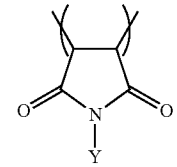

(2)

where the two Xs are independently a hydrogen atom, a C$_{1-5}$ alkyl group, a C$_{5-6}$ cycloalkyl group, a phenyl group, or a benzyl group; and Y is a hydrogen atom, a C$_{1-5}$ alkyl group, a C$_{5-6}$ cycloalkyl group, a phenyl group, or a benzyl group, provided that each of a part or all of the hydrogen atoms in the alkyl group, the cycloalkyl group, the phenyl group, and the benzyl group is optionally substituted with a halogen atom, a carboxy group, a hydroxy group, an amino group, or a nitro group.

2. The microlens according to claim 1, wherein the component (A) has at least one structural unit selected from the group consisting of Formula (4), Formula (5), and Formula (6) below:

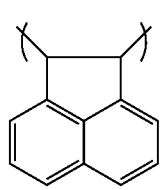
(4)
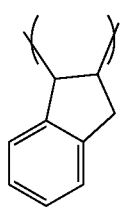
(5)
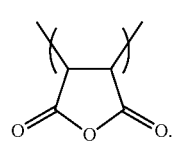
(6)
3. The microlens according to claim 1, wherein a weight-average molecular weight of the copolymer is from 1000 to 30000.
4. The microlens according to claim 1, further comprising a crosslinking agent as a component (C).
5. The microlens according to claim 3, further comprising a crosslinking agent as a component (C).
* * * * *